(12) United States Patent
Vogel et al.

(10) Patent No.: US 7,676,726 B2
(45) Date of Patent: Mar. 9, 2010

(54) STABILIZATION FOR RANDOM CHIP IDENTIFIER CIRCUIT

(75) Inventors: Danny C. Vogel, Sudbury, MA (US); Michael Okronglis, Prior Lake, MN (US)

(73) Assignee: LSI Corporation, Milpitas, CA (US)

( * ) Notice: Subject to any disclaimer, the term of this patent is extended or adjusted under 35 U.S.C. 154(b) by 849 days.

(21) Appl. No.: 11/530,518

(22) Filed: Sep. 11, 2006

(65) Prior Publication Data

US 2008/0063013 A1    Mar. 13, 2008

Related U.S. Application Data

(60) Provisional application No. 60/823,402, filed on Aug. 24, 2006.

(51) Int. Cl.
*H03M 13/13* (2006.01)
(52) U.S. Cl. .................. 714/752; 714/777; 714/819
(58) Field of Classification Search ........... 714/752, 714/777, 819
See application file for complete search history.

(56) References Cited

U.S. PATENT DOCUMENTS

| | | | |
|---|---|---|---|
| 6,161,213 A | 12/2000 | Lofstrom | |
| 6,678,197 B1 * | 1/2004 | Perner et al. | 365/206 |
| 6,738,788 B1 | 5/2004 | Horng et al. | |
| 6,802,447 B2 | 10/2004 | Horng | |
| 6,909,758 B2 * | 6/2005 | Ramesh et al. | 375/340 |
| 7,136,244 B1 * | 11/2006 | Rothberg | 360/53 |
| 2005/0183047 A1 | 8/2005 | Sapiro | |
| 2005/0262423 A1 * | 11/2005 | Liu et al. | 714/798 |

OTHER PUBLICATIONS www.siidtech.com, web site for SiidTech Inc., captured on Aug. 24, 2006.

* cited by examiner

*Primary Examiner*—Stephen M Baker
(74) *Attorney, Agent, or Firm*—Luedeka, Neely & Graham, P.C.

(57) ABSTRACT

A method of stabilizing an identification series of bits by iteratively reading the identification series and logical OR'ing the identification series with a mask string after each read of the identification series. This produces a mask string having a first value in all positions of the mask string where bits in the identification series have never changed value during all of the readings of the identification series, representing stable bits, and a second value in all positions of the mask string where bits in the identification series have changed value during at least one of the readings of the identification series, representing unstable bits. The number of the unstable bits in the mask string having the second value is counted, and a method failure code is selectively reported when the number of unstable bits exceeds a maximum allowable number of unstable bits. An identification string is produced from the stable bits, and an identification code is calculated from the identification string. The identification code does not disclose the identification string, but is able to confirm the accuracy of the identification string and selectively correct a given number of bits within a corrupted identification string. At least one of the identification string, the identification code, and the mask string are stored.

18 Claims, 4 Drawing Sheets

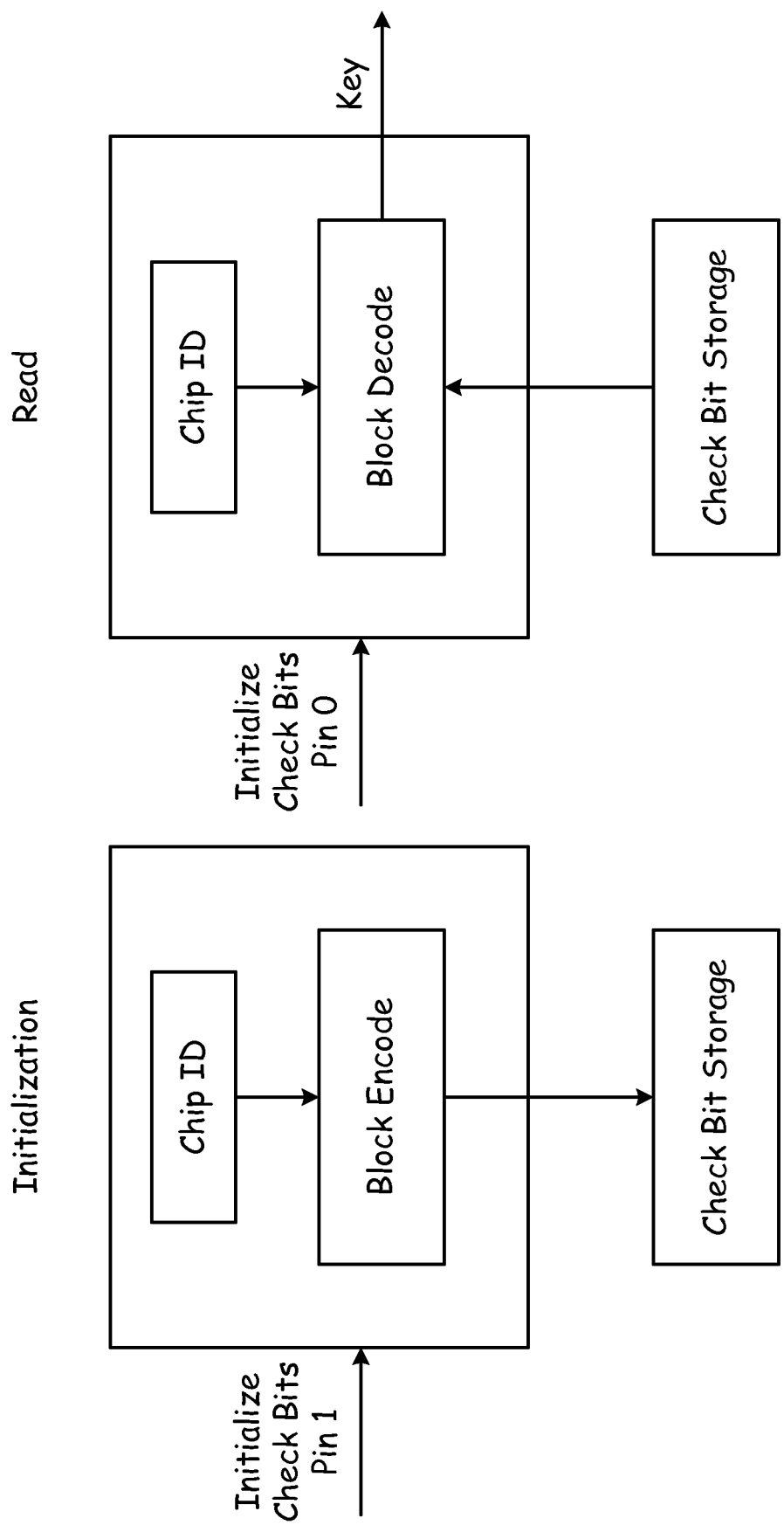

STABILIZATION FOR RANDOM CHIP IDENTIFIER CIRCUIT

This application claims priority on provisional application 60/823,402, filed 2006 Aug. 24.

FIELD

This invention relates to the field of integrated circuit fabrication. More particularly, this invention relates to uniquely identifying integrated circuits.

BACKGROUND

Integrated circuits have evolved into enormously complex devices, which are fabricated by equally complex processes. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

Integrated circuits are typically processed in a wafer form on a common semiconducting substrate, which substrate typically holds something in the neighborhood of a few hundred individual integrated circuits, depending on die size and wafer size. A variety of information on the processing of the substrate is typically recorded in a database. Thus, while the integrated circuits are in wafer form, it is relatively easy to look back upon the recorded processing history for the integrated circuits, by first identifying the substrate upon which the integrated circuits reside, and then accessing the information for the substrate. Such information can be very useful in determining the causes of problems that might be noticed at a later point in the fabrication cycle.

However, once the individual integrated circuits are singulated and packaged, it might be impossible to determine the substrate from which a given integrated circuit was taken, and the processing that the substrate received. However, for a variety of different reasons, such information could be extremely useful. For example, determining the processing given an integrated circuit that failed in the field could help prevent additional future failures for the same cause.

What is needed, therefore, is a system that overcomes problems such as those described above, at least in part.

SUMMARY

The above and other needs are met by a method of stabilizing an identification series of bits by iteratively reading the identification series and logical OR'ing the identification series with a mask string after each read of the identification series. This produces a mask string having a first value in all positions of the mask string where bits in the identification series have never changed value during all of the readings of the identification series, representing stable bits, and a second value in all positions of the mask string where bits in the identification series have changed value during at least one of the readings of the identification series, representing unstable bits. The number of the unstable bits in the mask string having the second value is counted, and a method failure code is selectively reported when the number of unstable bits exceeds a maximum allowable number of unstable bits. An identification string is produced from the stable bits, and an identification code is calculated from the identification string. The identification code does not disclose the identification string, but is able to confirm the accuracy of the identification string and selectively correct a given number of bits within a corrupted identification string. At least one of the identification string, the identification code, and the mask string are stored.

In this manner, the identification series is stabilized and can be used in a variety of applications that require substantially stable and unique strings, such as integrated circuit identification or encryption keys.

In various embodiments, producing the identification string is accomplished by at least one of setting the unstable bits to a specific value, removing the unstable bits from the identification series, truncating the identification string to a given length, and hashing the identification string to the given length. In some embodiments the identification code is calculated as one of a Hamming code and a Reed-Muller code. The identification string can be stored on a chip whereon the identification series of bits is generated. The identification code and the mask string can be stored off of the chip whereon the identification series of bits is generated, or on the chip. A circuit accomplishing the method is also described, as is an integrated circuit that includes the circuit.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 2 is a functional block diagram depicting the initialization of the chip identification circuit.

FIG. 3 is a functional block diagram depicting the use of the chip identification circuit.

DETAILED DESCRIPTION

With reference now to the figures, there is depicted a method and apparatus for providing a unique chip identification circuit for an integrated circuit, which chip identification does not require specialized processing to create the unique identification for the integrated circuit, and which is stable and can be reliably read across repeated instances and a duration of time.

In basic concept, there is provided a chip identification circuit and supporting circuitry in a design that is added to each individual integrated circuit as a part of the mask set for the integrated circuits. Thus, as the integrated circuits are fabricated in wafer form, the chip identification circuit is fabricated at the same time. Thus, no additional processing is required to fabricate the chip identification circuit.

Figure 1:
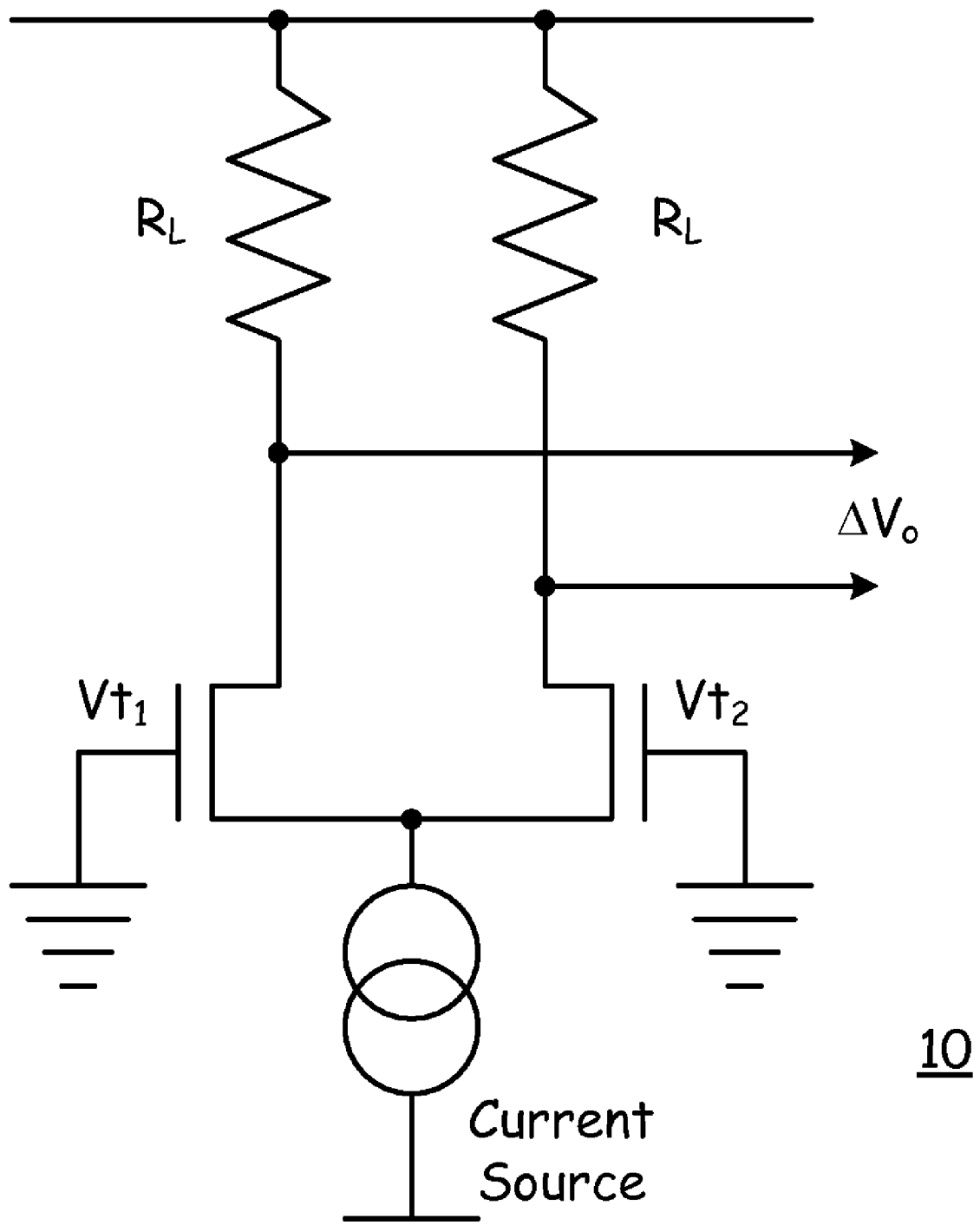
FIG. 1 is a circuit diagram of one embodiment of a die trace bit cell for use in a chip identification circuit.

The chip identification circuit preferably has at least one property such the chip identification circuits on different chips will produce at least one characteristic that is different from chip to chip, even though the chip identification circuit on each of the different chips receives the same input. FIG. 1 depicts a die trace bit cell 10, from which a chip identification circuit having such properties can be constructed. The cell 10 comprises two transistors having a voltage threshold $Vt_1$ and $Vt_2$. The two transistors are preferably connected to a common current source, ground, and current drain through two resistors $R_L$.

Because of the similarities in the fabrication and design of the two transistors, it might be expected that they would have exactly the same voltage threshold. However, very subtle differences in the transistors typically arise such as by "chance" or other uncharacterized processing and material differences. Thus, there tends to be a measurable difference $\Delta V_0$ between the voltage thresholds $Vt_1$ and $Vt_2$. Depending upon the which of the two voltage thresholds is greater than the other, this voltage difference can be interpreted as either a logical zero or a logical one from the bit cell 10. Practically speaking, the value of the bit cell 10, either zero or one, tends to be completely random from one integrated circuit to another.

Thus, by stringing together a given number of the bit cells 10, a chip identification circuit can be formed that has a desired number of random values. For example, 128 of the bit cells 10 could be formed into a chip identification circuit, and the chip identification circuit would have a random 128 bit value. By forming a chip identification circuit with a great enough number of bit cells 10 (where "great enough" is determined by the number of integrated circuits that are to be identified), each integrated circuit having the chip identification circuit can be uniquely identified by reading the chip identification circuit. In this case, "uniquely" means that the probability of two chips having the same random chip identification circuit value is extremely low, albeit possible.

Unfortunately, some of the bit cells 10 have transistors with voltage thresholds $Vt_1$ and $Vt_2$ that are so close in value one to another, that the voltage differential $\Delta V_0$ is either so small that it cannot be reliably read, or actually flips back and forth in value from negative to positive (for example). Thus, such a bit cell 10, referred to as a soft cell, would tend to change its value in an unpredictable manner as it is read from time to time, thereby changing the value of the chip identification circuit. This tends to make the chip identification circuit unreliable as a means for uniquely and repeatedly identifying the integrated circuit.

Therefore, it is desirable to identify such soft cells 10, and remove them in some manner from the chip identification circuit. FIG. 2 depicts an overview of this method, where an initialization bit is set to instruct the chip identification circuit and associated circuitry to encode and store in some manner the value chip identification circuit, such as by setting the pin for the initialization bit to a logical one. When this is done, the chip identification circuit is read and encoded, such as to preferably remove the values of the soft bits, and then the encoded value is stored.

Subsequently, when the chip identification circuit is to be read so as to identify the chip on which it resides, the pin for the initialization bit is set to a different value, such as a logical zero, for example, and the chip identification circuit is preferably decoded using the stored encoded value, to produce the identification key for the given integrated circuit.

Thus, there are two basic steps that are preferably used to produce the chip identification key or number or value from the chip identification circuit. First, the soft bits are identified, and second, a stable chip identification value is produced for the integrated circuit. These two steps are described in greater detail below.

Figure 4:
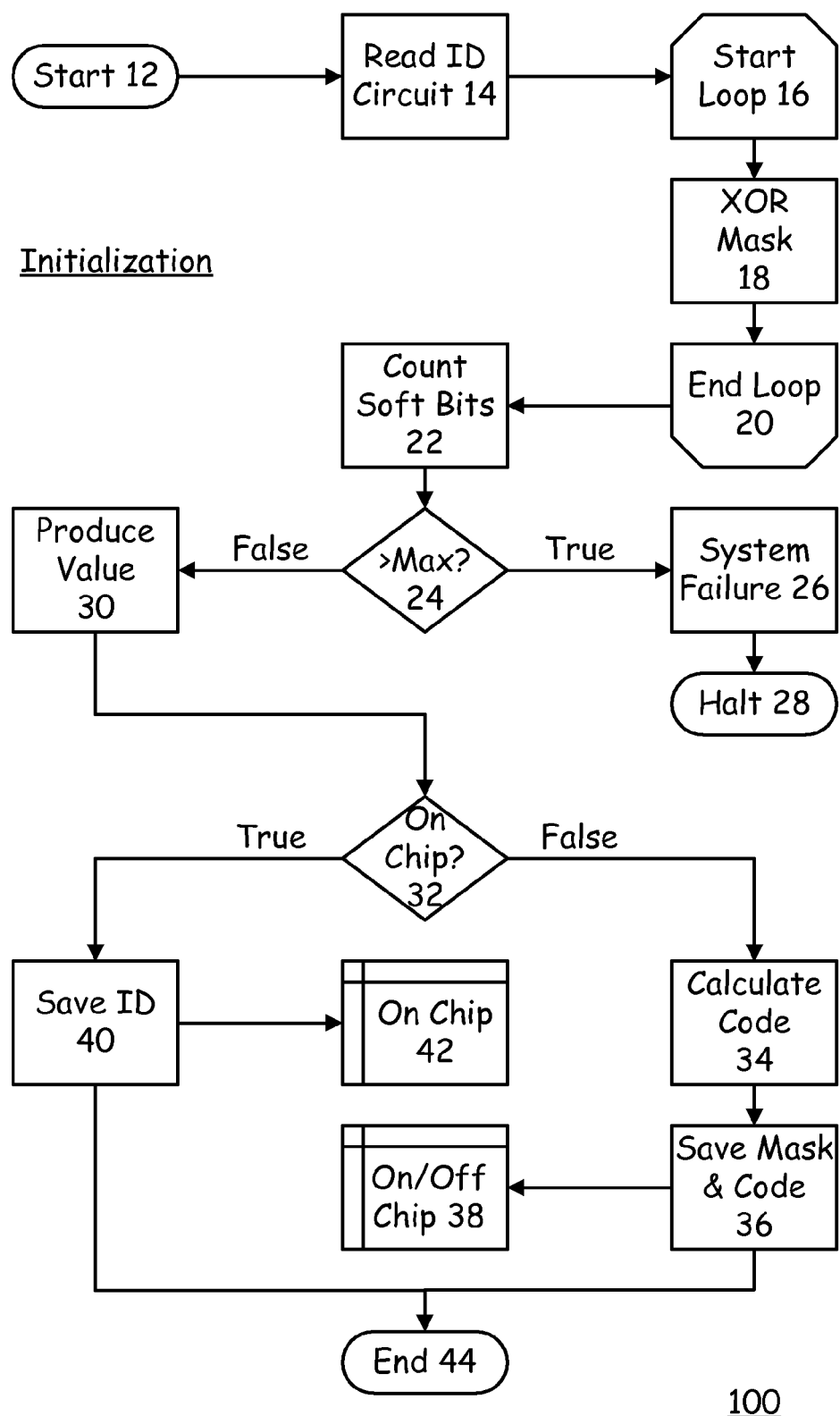
FIG. 4 is a flow chart depicting the initialization of the chip identification circuit.

FIG. 4 depicts a flow chart for a method 100 of initializing a chip identification circuit, as was depicted in a simplified functional block diagram form in FIG. 2. The method 100 starts at block 12, by reading the bit cells 10 of the chip identification circuit, as given in block 14. A loop is entered as at block 16, where a mask for the chip identification circuit is produced. The mask is a structure that is used to logically remove the soft cells from the chip identification circuit. This is preferably accomplished by repeatedly reading the values of the bit cells in the chip identification circuit, and tracking those bit cells that change their value.

One method of doing this is to read the logical values that are read from the bit cells of the chip identification circuit into a mask on a first pass, and then XOR the logical values that are read from the bit cells on subsequent reads of the chip identification circuit with the value from the first pass. Those bit cells that change their value will end up with a logical value of one in the mask, and those bit cells that do not change their value will end up with a logical value of zero in the mask, which may be referred to as the intermediate soft bits mask. This process of iteratively reading the bit cells of the chip identification circuit can be repeated as many times as desired, logically OR'ing the intermediate soft bits masks together each time, such as to statistically remove any realistic probability that any soft bits have been overlooked in the process. When this number of iterations has been accomplished, the loop ends as given in block 20, and the intermediate soft bits mask contains a mask of all bits that changed at any time during the iterative process.

The number of soft bits (with mask values of one, for example) in the chip identification circuit is preferably counted as given in block 22, and then compared to a specified maximum number of soft bits as given in block 24, as a safety precaution. For example, if the number of soft bits could be set to the same number as the number of bits in the identification value, then the identification of the circuit could be spoofed by setting all the bits to zero. If the maximum number of soft bits is greater than the maximum number allowed, then a system failure is reported as given in block 26, and the method 100 halts as in block 28.

However, if the number of soft cells is less than the desired maximum number allowed, then the method 100 continues to block 30, where the identification value for the chip is produced, for example, by OR'ing the value that is read from the chip identification circuit with the mask, which sets all of the soft bits to a logical value of zero. Thus producing a stable, unique identification value for the chip.

Either the identification value itself can be stored, or alternately, values that can be used to produce the identification value can be stored. This decision is made in block 32. If the identification value itself is to be stored on the chip, then the storage of the identification value is accomplished as in block 40 to an on chip location 42. Preferably, the identification value is not stored off of the chip, for security purposes. If the identification value itself is not to be stored on the chip, then a code is preferably calculated as given in block 34, and the mask and the code are saved as given in block 36 onto either an on chip location or an off chip location 38. More about the code is given below. In either event, the initialization process 100 then ends as given in block 44. The storage locations 38 and 42 can be structures such EEPROM, flash, disk, or other memory/storage structures.

The calculation of the code as given in block 34 preferably produces some type of encrypted identification value, which can then be transferred off of the chip without undue fear of exposing the unique identification value. For example a Hamming code or Reed-Muller code can be constructed, which may be used to correct previously undetected soft bits during a subsequent read of the chip identification circuit. This is a second mechanism by which soft bits are corrected and thus stabilized. Utilizing a correction code after the known soft bits are masked off tends to reduce the potential number of bits that must be corrected, thus reducing the size of the correction code required.

A Reed-Muller or similar algorithm works something like ECC on a memory chip. It creates a code that can be compared to a value read (the identification circuit output after soft bit masking) to determine whether this is the original value that created the code. Furthermore, the algorithm is able, using the code, to correct up to a fixed number of bits that are incorrect. The fixed number of bits is determined by the exact algorithm/coding implemented. For example, SECDED (Single Error Correct Double Error Detect) is an ECC mechanism that can correct only one error. The length of the SECDED code is dependent on the length of the data word being protected. The present method may employ a variety of one or more different algorithms, based at least in part on the many variables that can differ from implementation to implementation of the method, including: a) the number of bits to be read for identification, b) the number of desired stable bits in the identification, c) the method of reducing the string to the desired bit count (hash, truncate, eliminate soft, etc.), and d) the number of soft bits to be protected against (dependent at least in part on the number of initial reads and the statistics on how many soft bits are detected).

The identification value for the chip need not have the same bit length as the chip identification circuit. For example, the chip identification circuit may have 256 bits and the identification value may have 128 bits. This reduction in bit length can be done in a variety of different ways. For example, all of the soft bits could be removed from the chip identification circuit to produce the identification value. Alternately, the identification value produced as described above is truncated to a desired length. In another embodiment, identification value is hashed down in some more complex manner to the desired length, such as by a polynomial division. However, in other embodiments the chip identification circuit and the identification value have the same bit length.

Figure 5:
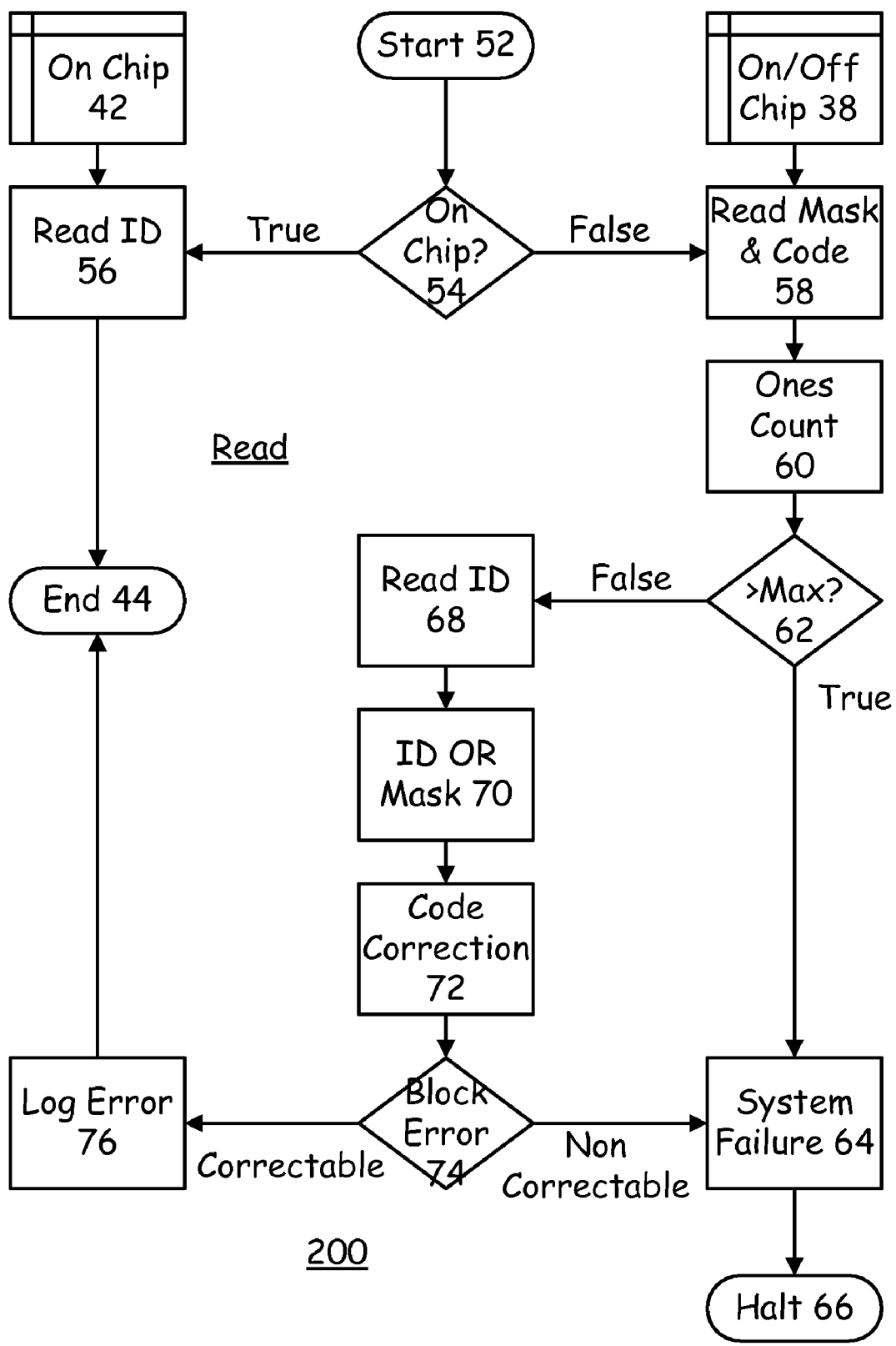
FIG. 5 is a flow chart depicting the use of the chip identification circuit.

FIG. 5 depicts a flow chart of one method of reading the identification value, which is briefly depicted in FIG. 3 in function block diagram form. The reading method 200 is entered at block 52, and starts by determining whether the identification value was stored on the chip or off the chip, as given in block 54. If the identification value was stored on the chip, then it is read as given in block 56 from the on chip memory 42. At this point the read process is completed, and ends as in block 44.

However, if the identification value itself has not been stored on the chip, then the mask and code have been stored, and are read as given in block 58, either from on chip storage or off chip storage 38. The number of soft bits is counted as given in block 60, such as by reading the number of bits set to a logical value of one, as described in one of the examples above. The number of soft bits is preferably checked against a maximum value as given in block 62, which again is a security measure to ensure that neither the code or the mask are spoofed by setting all of the bits to a given value. If the soft bits value is greater than the maximum, then a system failure is reported as given in block 64, and the read method 200 halts as in block 66.

If the maximum soft bits value is not violated, however, then the chip identification circuit is read as given in block 68, and the mask is applied to the values read from the chip identification circuit, as given in block 70, to mask out the soft bits and preferably force them to a given value.

The results of the code correction 72 are inspected for a block error as given in 74. If any block error is a non-correctable error, such as described above in regard to the coding, then a system failure is reported as given in block 64, and the read process 200 is halted as given in block 66. If, however, any block error is a correctable error, then the error is optionally logged as given in block 76, the error is corrected to recreate the unique identification value, and the read process ends as in block 44.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of stabilizing an identification series of bits, the method comprising:

iteratively reading the identification series, and logical OR'ing the identification series with a mask string after each read of the identification series, to produce a mask string having a first value in all positions of the mask string where bits in the identification series have never changed value during all of the readings of the identification series, representing stable bits, and a second value in all positions of the mask string where bits in the identification series have changed value during at least one of the readings of the identification series, representing unstable bits, counting a number of the unstable bits in the mask string having the second value, and selectively reporting a method failure code when the number of unstable bits exceeds a maximum allowable number of unstable bits, producing an identification string from the stable bits, calculating an identification code from the identification string, where the identification code does not disclose the identification string but is able to confirm the accuracy of the identification string and selectively correct a given number of bits within a corrupted identification string, and storing at least one of the identification string, the identification code, and the mask string.

2. The method of claim 1, wherein producing the identification string comprises at least one of setting the unstable bits to a specific value, removing the unstable bits from the identification series, truncating the identification string to a given length, and hashing the identification string to the given length.

3. The method of claim 1, wherein the identification code is calculated as one of a Hamming code and a Reed-Muller code.

4. The method of claim 1, wherein the identification string is stored on a chip whereon the identification series of bits is generated.

5. The method of claim 1, wherein the identification code and the mask string are stored off of a chip whereon the identification series of bits is generated.

6. The method of claim 1, wherein the identification code and the mask string are stored on a chip whereon the identification series of bits is generated.

7. A circuit for stabilizing an identification series of bits, the circuit comprising logical elements adapted for:
- iteratively reading the identification series, and logical OR'ing the identification series with a mask string after each read of the identification series, to produce a mask string having a first value in all positions of the mask string where bits in the identification series have never changed value during all of the readings of the identification series, representing stable bits, and a second value in all positions of the mask string where bits in the identification series have changed value during at least one of the readings of the identification series, representing unstable bits,
- counting a number of the unstable bits in the mask string having the second value, and selectively reporting a method failure code when the number of unstable bits exceeds a maximum allowable number of unstable bits,
- producing an identification string from the stable bits,
- calculating an identification code from the identification string, where the identification code does not disclose the identification string but is able to confirm the accuracy of the identification string and selectively correct a given number of bits within a corrupted identification string, and
- storing at least one of the identification string, the identification code, and the mask string.

8. The circuit of claim 7, wherein producing the identification string comprises at least one of setting the unstable bits to a specific value, removing the unstable bits from the identification series, truncating the identification string to a given length, and hashing the identification string to the given length.

9. The circuit of claim 7, wherein the identification code is calculated as one of a Hamming code and a Reed-Muller code.

10. The circuit of claim 7, wherein the identification string is stored on a chip whereon the circuit is disposed.

11. The circuit of claim 7, wherein the identification code and the mask string are stored off of a chip whereon the circuit is disposed.

12. The circuit of claim 7, wherein the identification code and the mask string are stored on a chip whereon the circuit is disposed.

13. An integrated circuit including a circuit for stabilizing an identification series of bits, the circuit comprising logical elements adapted for:
- iteratively reading the identification series, and logical OR'ing the identification series with a mask string after each read of the identification series, to produce a mask string having a first value in all positions of the mask string where bits in the identification series have never changed value during all of the readings of the identification series, representing stable bits, and a second value in all positions of the mask string where bits in the identification series have changed value during at least one of the readings of the identification series, representing unstable bits,
- counting a number of the unstable bits in the mask string having the second value, and selectively reporting a method failure code when the number of unstable bits exceeds a maximum allowable number of unstable bits,
- producing an identification string from the stable bits,
- calculating an identification code from the identification string, where the identification code does not disclose the identification string but is able to confirm the accuracy of the identification string and selectively correct a given number of bits within a corrupted identification string, and
- storing at least one of the identification string, the identification code, and the mask string.

14. The integrated circuit of claim 13, wherein producing the identification string comprises at least one of setting the unstable bits to a specific value, removing the unstable bits from the identification series, truncating the identification string to a given length, and hashing the identification string to the given length.

15. The integrated circuit of claim 13, wherein the identification code is calculated as one of a Hamming code and a Reed-Muller code.

16. The integrated circuit of claim 13, wherein the identification string is stored on the integrated circuit.

17. The integrated circuit of claim 13, wherein the identification code and the mask string are stored off of the integrated circuit.

18. The integrated circuit of claim 13, wherein the identification code and the mask string are stored on the integrated circuit.

* * * * *